United States Patent [19]

Dixon et al.

[11] Patent Number: 5,413,694
[45] Date of Patent: May 9, 1995

[54] METHOD FOR IMPROVING ELECTROMAGNETIC SHIELDING PERFORMANCE OF COMPOSITE MATERIALS BY ELECTROPLATING

[75] Inventors: David S. Dixon, Old Lyme; Michael D. Obara, Mystic, both of Conn.; James V. Masi, Wilbraham; William G. Bradley, Springfield, both of Mass.

[73] Assignee: The United States of America as represented by the Secretary of the Navy, Washington, D.C.

[21] Appl. No.: 105,316

[22] Filed: Jul. 30, 1993

[51] Int. Cl.⁶ .......................... C25D 5/24; C25D 5/00
[52] U.S. Cl. .................................... 205/158; 205/164; 205/220; 264/22; 523/204; 523/210; 523/300
[58] Field of Search ................. 205/91, 189, 164, 162, 205/158, 220; 523/215, 300, 204, 210; 524/431, 434, 440; 264/22

[56] References Cited

U.S. PATENT DOCUMENTS

| | | | |
|---|---|---|---|
| 4,447,492 | 5/1984 | McKaveney | 428/328 |
| 5,066,424 | 11/1991 | Dixon et al. | 252/518 |
| 5,173,169 | 12/1992 | Garrison et al. | 205/91 |

*Primary Examiner*—Kathryn Gorgos
*Attorney, Agent, or Firm*—Michael J. McGowan; Prithvi C. Lall; James M. Kasischke

[57] ABSTRACT

A method of improving the electromagnetic (EM) shielding performance of a composite material is provided. The composite material has conductive and semiconductive filler particles suspended in a non-conductive resin. The filler particles can be up to 40 weight percent of the composite material. The composite material is electroplated with a conductive material onto a portion of its surface to improve the electrical connection between the conductive material and a portion of the filler particles. EM shielding performance can be further enhanced by injecting an exponentially decaying electromagnetic pulse through the composite material that has been electroplated.

10 Claims, No Drawings

METHOD FOR IMPROVING ELECTROMAGNETIC SHIELDING PERFORMANCE OF COMPOSITE MATERIALS BY ELECTROPLATING

STATEMENT OF GOVERNMENT INTEREST

The invention described herein may be manufactured and used by or for the Government of the United States of America for Governmental purposes without the payment of any royalties thereon or therefor.

This patent application is co-pending with related patent application entitled "Method for Improving Electromagnetic Shielding Performance of Composite Materials By Electropulsing" filed on the same date as this application.

BACKGROUND OF THE INVENTION

1. Field of the Invention

The present invention relates generally to electromagnetic (EM) shielding, more particularly to an electroplating electromagnetic pulsing method for improving the EM shielding performance of a composite material having semi-conductive or conductive filler particles suspended in a non-conductive or semi-conductive resin.

2. Description of the Prior Art

The EM environment encountered in commercial/military applications grows ever more "noisy" as the number of electronic components on a given platform increases. Further, the current desire to use strong, lightweight materials in construction of shielded structures provides an incentive to develop composite materials offering good EM shielding performance that will not degrade over time. To be useful for a range of application, the composite must have a low resistivity, be resistant to chemical attack, immune to shock (both thermal and mechanical), machinable, moldable and usable in high temperature environments (e.g., greater than 200° C.). The composite must further be capable of being utilized in commercial and military applications including aircraft and shipboard environments. Accordingly, the composite must be lightweight, corrosion resistant when connected to metal structures (e.g., aluminum) and must provide an EM shielding performance at least as good as the present compounds that incorporate aluminum, carbon, stainless steel and nickel-plated carbon fillers.

Prior U.S. Pat. No. 5,066,424 issued to Dixon et al. discloses certain oxides and catalytic behaving materials that "self-adjust" their electrochemical electromotive force. Such adjustment is either by oxygen manipulation or other charge transfer thereby making them extremely attractive in minimizing corrosion caused by the dissimilar galvanic potentials. These composites display good EM shielding properties when connected to materials that are dissimilar with respect to the galvanic table. However, still higher levels of EM performance are desirable before these composites will be accepted as replacements for pure metals and alloys in terms of EM shielding performance.

As disclosed by Dixon et al., various composites offering good EM shielding performance are composed of conducting and semi-conducting oxide particles, fibers or flakes suspended in a non-conducting polymeric material matrix. The surface of the composite is, for the most part, formed by the non-conducting material. Therefore, electrical connection to the composite material is typically made by etching away a portion of the surface to expose a sufficient amount of the filler particles for purposes of electrical conductivity with the filler particles. In order to electrically conduct with sufficient amount of the filler particles, a large surface area of the composite must be etched. However, etching the surface exposes the filler particles to oxidation. Further, it is difficult to make and maintain good electrical connection with all of the exposed filler particles thereby limiting energy transfer to and from the composite. As a result, etching may negatively effect the overall EM shielding performance of the composite.

SUMMARY OF THE INVENTION

Accordingly, it is an object of the present invention to provide a method of improving the EM shielding performance of a composite material having conducting and semi-conducting filler particles suspended therein.

Another object of the present invention is to provide a method of improving the overall EM shielding performance of a composite material by improving electrical conductivity with the composite material's conducting and semi-conducting filler particles.

Other objects and advantages of the present invention will become more obvious hereinafter in the specification and drawings.

In accordance with the present invention, a method of improving the electromagnetic (EM) shielding performance of a composite material is provided. The composite material has conductive and semi-conductive filler particles suspended in a non-conductive resin. The filler particles can be up to 40 weight percent of the composite material. The composite material is electroplated with a conductive material onto a portion of its surface causing the conductive material to electrically connect to a portion of the filler particles. EM shielding performance can be further enhanced by then injecting an exponentially decaying electromagnetic pulse through the composite material. The energy of the pulse is less than that required to cause localized melting. In a preferred embodiment, the resin comprises a preselected weight percent of a matrix material selected from the group consisting of a polyether etherketone (PEEK) polymer and a polycarbonate polymer. The filler particles comprise 0–10 weight percent conducting nickel flake particles and 5–15 weight percent non-corrosive semi-conducting indium tin oxide particles.

DESCRIPTION OF THE PREFERRED EMBODIMENT(S)

The composite material improved by the method of the present invention is comprised of a filler molded into a resin. The filler is composed of conducting and semi-conducting oxide particles, fiber or flakes suspended in the resin comprised of a polymeric material matrix. A class of such composite materials is disclosed by Dixon et al. in U.S. Pat. No. 5,066,424, which is hereby incorporated by reference. However, it will be readily understood by one of ordinary skill in the art that other composite materials will have their EM shielding performance improved by the method of the present invention. Several examples of additional composite materials will be given in the description to follow.

In accordance with the present invention, the composite material samples are partially electroplated with "pure" copper from a 20% copper sulfate solution in water. However, it is to be understood that the composite can alternatively be electroplated with gold, silver or other suitable conducting alloys containing copper, gold or silver.

The electroplating process consists of masking the samples so that only the portion of the surfaces to be plated are exposed. The sample and a greater than 99% OFHC copper anode are lowered into a 10% copper sulfate solution. A low level DC current (current density of 5 ASF) is applied from anode to cathode until the desired plating coverage and thickness (in this case, 0.001" after 10 minutes) is achieved. However, it is to be understood that any other state-of-the-art electroplating technique using a variety of materials such as copper, nickel and tin may be used with equal success.

In the examples and results to follow, the resin is either a polyether etherketone (PEEK) polymer or a polycarbonate polymer. Fillers evaluated include graphite fibers and flake, nickel-coated graphite fibers, carbon particles, iron oxide, indium/tin oxide (ITO) particles, ITO particles with graphite fibers, ITO/Ni-flake, and combinations of the above. Based on the composites tested, the preferred filler composition consists of two elements: (1) nickel because of its inherent low resistivity and its corrosion resistance properties in combination with the ITO, and (2) ITO which along with the nickel provides excellent corrosion resistance. The semiconductor (ITO) also increases the overall conductivity of the composite thereby increasing the EM shielding effectiveness. The preferred percentages of the fillers by weight for the nickel are from 0% to 10% and for the ITO are from 0% to 20%. Preferred percentages by weight of other fillers mentioned above are from 0% to 20%. It is expected that other combinations of metallic and semi-metallic filler particles (such as silver-coated nickel, silver-coated aluminum, 400 series stainless steel, etc.) and polymers may also have their EM shielding performance similarly improved.

EXAMPLES AND RESULTS

The improvement in EM shielding performance for five examples will now be presented. The five example composites are:

1) 10 weight percent nickel flake 15 weight percent ITO 75 weight percent PEEK
2) 10 weight percent nickel flake 15 weight percent ITO 75 weight percent polycarbonate
3) 20 weight percent graphite fibers 80 weight percent polycarbonate
4) 15 weight percent graphite fibers 10 weight percent nickel flake 75 weight percent polycarbonate
5) 15 weight percent nickel coated graphite fibers 85 weight percent polycarbonate A reduced DC resistivity is one indicator of improved EM shielding performance. Table 1 shows the before and after plating DC resistivities for the five examples. Note that all five examples improve substantially after plating.

TABLE 1

Comparison of Measured DC Resistivities of Samples Before and After Electroplating Treatment

| EXAMPLE NO. | MATERIAL | BEFORE RESIST. (Ω-cm) | AFTER RESIST. (Ω-cm) | IMPROVEMENT (dB) |
|---|---|---|---|---|
| 1 | ITO, Ni-Flake, PEEK | >2 M | 12.7 | >100 |
| 2 | ITO, Ni-Flake Polycarbonate | 123 | 20.2 | 16 |
| 3 | Graphite, Polycarbonate | 58.1 | 14.6 | 12 |
| 4 | Graphite, Ni-Flake, Polycarbonate | 293 | 22.1 | 22 |
| 5 | Nickel Coated Graphite, Polycarbonate | >60 K | 222 | >40 |

Shielding effectiveness (SE) is defined as the reduction in magnetic or electric field strengths caused by the shielding material. It is the measure of the quality of the EM performance of that material. Conventional units of SE are decibels (dB). The SE of a material relies on three types of losses: reflection, absorption, and re-reflection of the EM fields. The losses are due to the reflection at the first boundary, absorption through the material, and reflection at the second boundary, respectively. Table 2 shows the post-plating SE improvement for each of the five examples at 1 MHz.

TABLE 2

Measured Shielding Effectiveness at 1 MHz

| EXAMPLE NO. | MATERIAL | BEFORE SE (dB) | AFTER SE (dB) | IMPROVEMENT (dB) |
|---|---|---|---|---|
| 1 | ITO, Ni-flake, PEEK | 0 | 25 | 25 |
| 2 | ITO, Ni-Flake Polycarbonate | 10 | 28 | 18 |
| 3 | Graphite, Polycarbonate | 2 | 18 | 16 |
| 4 | Graphite, Ni-Flake, Polycarbonate | 0 | 28 | 28 |
| 5 | Nickel Coated Graphite, Polycarbonate | 0 | 3 | 3 |

The advantages of the present invention are numerous. The EM shielding performance improvement after electroplating indicates that this technique is far superior to etching or other surface treatments as a means of making good electrical contact with a composite's conducting and semi-conducting filler particles. Electroplating penetrates the surface of the composite to bond the plating material to the conductive and semi-conductive filler particles.

Further improvement in shielding effectiveness can be achieved by subjecting the electroplated samples to an EM pulse as described in the aforementioned copending application Ser. No. 08/105,318. For the five examples described herein, Tables 3 and 4 respectively show that a further reduction in DC resistivity and increased shielding effectiveness is achieved for most of the examples.

TABLE 3

Comparison of Measured DC Resistivities of Samples After Electroplating and Pulsing Treatment

| EX. NO. | MATERIAL | BEFORE RESIST. (Ω-cm) | AFTER PLATING RESIST. (Ω-cm) | AFTER PLATING & PULSING (Ω-cm) | ADDITIONAL IMPROVEMENT AFTER PULSING (dB) |
|---|---|---|---|---|---|
| 1 | ITO, Ni-Flake, PEEK | >2M | 12.7 | 1.35 | 19 |
| 2 | ITO, Ni-Flake Polycar. | 123 | 20.2 | 8.26 | 9 |
| 3 | Graphite, Polycar. | 58.1 | 14.6 | 6.45 | 7 |
| 4 | Graphite, Ni-Flake, Polycar. | 293 | 22.1 | 7.76 | 9 |
| 5 | Nickel Coated Graphite, Polycar. | >60K | 222 | 245 | −1 |

TABLE 4

Measured Shielding Effectiveness at 1 MHz

| EX. NO. | MATERIAL | BEFORE SE (dB) | AFTER PLATING SE (dB) | AFTER PLATING & PULSING SE (dB) | ADDITIONAL IMPROVEMENT AFTER PULSING (dB) |
|---|---|---|---|---|---|
| 1 | ITO, Ni-Flake, PEEK | 0 | 25 | 44 | 19 |
| 2 | ITO, Ni-Flake Polycar. | 10 | 28 | 36 | 8 |
| 3 | Graphite, Polycar. | 2 | 18 | 26 | 8 |
| 4 | Graphite, Ni-Flake, Polycar. | 0 | 28 | 25 | −3 |
| 5 | Nickel Coated Graphite, Polycar. | 0 | 3 | 4 | 1 |

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method of improving the electromagnetic (EM) shielding performance of a composite material having filler particles that are at least semi-conductive suspended in a non-conductive resin, comprising the steps of:
   electroplating a conductive material having a surface onto the surface of said composite material to cause said conductive material to electrically connect to a portion of said filler particles; and
   injecting, after said step of electroplating, an exponentially decaying electromagnetic pulse through said composite material with said conductive material electroplated thereon, wherein energy of said pulse is less than that required to cause localized melting of said composite material with said conductive material electroplated thereon.

2. A method according to claim 1 wherein said filler particles comprise up to 40 weight percent of said composite material.

3. A method according to claim 1 wherein said resin comprises a preselected weight percent of a matrix material selected from the group consisting of a polyether etherketone (PEEK) polymer and a polycarbonate polymer, and wherein said filler particles comprise up to 0-10 weight percent conducting nickel flake particles and 5-15 weight percent non-corrosive semi-conducting indium tin oxide particles, said preselected weight percent of said matrix material comprising the remainder of said composite.

4. A method according to claim 3 said matrix material is a PEEK polymer.

5. A method according to claim 4 wherein said filler particles comprise 10 weight percent nickel flake particles, 15 weight percent indium tin oxide particles, and 75 weight percent PEEK polymer.

6. A method according to claim 3 wherein said matrix material is a polycarbonate polymer.

7. A method according to claim 5 wherein said filler particles comprise 10 weight percent nickel flake particles, 15 weight percent indium tin oxide particles, and 75 weight percent polycarbonate polymer.

8. A method according to claim 3 wherein said conductive material is selected from the group consisting of gold, silver, copper and alloys thereof.

9. A method according to claim 8 wherein said conductive material is copper.

10. A method according to claim 1 wherein said conductive material is selected from the group consisting of gold, silver, copper and alloys thereof.

* * * * *